(12) United States Patent
Menon et al.

(10) Patent No.: US 7,160,673 B2
(45) Date of Patent: Jan. 9, 2007

(54) SYSTEM AND METHOD FOR HOLOGRAPHIC FABRICATION AND REPLICATION OF DIFFRACTIVE OPTICAL ELEMENTS FOR MASKLESS LITHOGRAPHY

(75) Inventors: Rajesh Menon, Boston, MA (US); Dario Gil, Cambridge, MA (US); David J. Carter, Cambridge, MA (US); George Barbastathis, Boston, MA (US); Henry I. Smith, Sudbury, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 411 days.

(21) Appl. No.: 10/677,804

(22) Filed: Oct. 2, 2003

(65) Prior Publication Data
US 2004/0135100 A1    Jul. 15, 2004

Related U.S. Application Data

(60) Provisional application No. 60/415,720, filed on Oct. 3, 2002.

(51) Int. Cl.
*G02B 3/08* (2006.01)
(52) U.S. Cl. .............................. 430/321; 430/1; 430/2
(58) Field of Classification Search ............... None
See application file for complete search history.

(56) References Cited

U.S. PATENT DOCUMENTS

| | | | |
|---|---|---|---|
| 5,900,637 A | 5/1999 | Smith | |
| 6,107,000 A | 8/2000 | Lee et al. | |
| 6,285,817 B1 * | 9/2001 | Hobbs | ........................ 385/147 |

FOREIGN PATENT DOCUMENTS

EP    0 737 902    10/1996

OTHER PUBLICATIONS

"Fabrication of holographic microlenses using a deep UV lithographed zone plate," Ming et al. *Applied Optics*. Dec. 1990. vol. 29, No. 34.
"Fabrication of diffractive optical elements using a single optical exposure with a gray level mask," Daschner et al. *J. Vac. Sci. Technol. B.*, Nov./Dec. 1995, vol. 13.

* cited by examiner

*Primary Examiner*—John A. McPherson
(74) *Attorney, Agent, or Firm*—Gauthier & Connors LLP

(57) ABSTRACT

A method is disclosed for forming an array of focusing elements for use in a lithography system. In accordance with an embodiment, the method includes the steps of providing a master element that includes at least one diffractive pattern at a first location with respect to a target surface, illuminating the master element to produce a first diffractive pattern on the target surface at the first location, moving the master element with respect to the target surface to a second location with respect to the target surface, and illuminating the master element to produce a second diffractive pattern on the target surface at the second location.

19 Claims, 5 Drawing Sheets

SYSTEM AND METHOD FOR HOLOGRAPHIC FABRICATION AND REPLICATION OF DIFFRACTIVE OPTICAL ELEMENTS FOR MASKLESS LITHOGRAPHY

PRIORITY

This application claims priority to U.S. Provisional Application Ser. No. 60/415,720 filed Oct. 3, 2002.

This invention was made with support from the United States government under Subcontract No. BX-7699 and Prime Grant No. F19628-00-C-0002, awarded by the Air Force, and the United States government has certain rights to the invention.

BACKGROUND OF THE INVENTION

The invention relates to maskless lithography, and relates in particular to maskless lithography using arrays of focusing elements.

U.S. Pat. No. 5,900,637 discloses a system for maskless lithography that involves the focusing of incident energy from a single energy source onto a substrate as focused beamlets. The arrangement includes micro-mechanical devices with actuatable shutters that turn the focused beams on and off in response to commands from a control computer. To write a pattern, the substrate is scanned under the array, while the individual beams are turned on and off as needed by means of the micro-mechanical shutters, one associated with each zone plate. These shutters are disclosed to be located either between the zone plate array and the substrate, or between the zone plate array and the source of radiation. The '637 patent also discloses a lithography system that includes an array of micro-mechanical, deflectable glancing-angle mirrors that may be used to turn individual focused beams on and off.

Such lithography systems, however, require that zone plate arrays be very precise and uniform without significant variation. In certain applications the use of individually created zones on zone plates may not be appropriate.

There remains a need therefore, for an improved method of forming arrays of zone plates or other diffractive elements for a maskless lithography system.

SUMMARY OF THE INVENTION

The invention provides a method for forming an array of focusing elements for use in a lithography system. In accordance with an embodiment, the method includes the steps of providing a master element that includes at least one diffractive pattern at a first location with respect to a target surface, illuminating the master element to produce a first diffractive pattern on the target surface at the first location, moving the master element with respect to the target surface to a second location with respect to the target surface, and illuminating the master element to produce a second diffractive pattern on the target surface at the second location.

BRIEF DESCRIPTION OF THE DRAWINGS

The following description may be further understood with reference to the accompanying drawings in which.

The drawings are shown for illustrative purposes and are not to scale.

DETAILED DESCRIPTION OF THE ILLUSTRATED EMBODIMENTS

Systems and methods in accordance with different embodiments of the invention may be used to form arrays of a variety of focusing elements, such as arrays Fresnel zone plates. In accordance with certain embodiments, the invention provides a method of fabrication and reproduction of arrays of diffractive optical elements by means of holography. In particular, a master holographic element (MHE) carrying a master pattern may first be recorded by optical, electron-beam or other means of lithography. Subsequently the master pattern may be replicated according to a variety of processes.

Figure 1A:
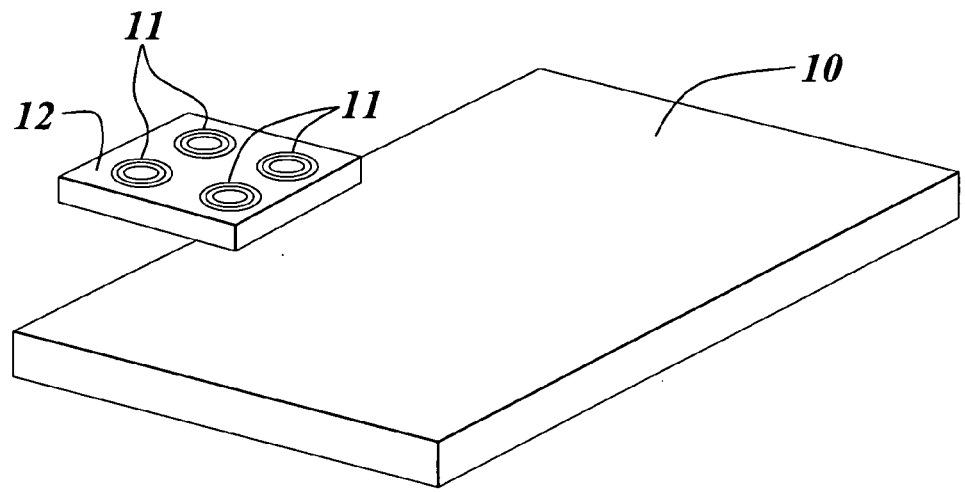
FIGS. 1A–1D show illustrative diagrammatic isometric views of a system in accordance with an embodiment of the invention in which a daughter array of zone plates is fabricated by the interference of the $1^{st}$ and $3^{rd}$ order radiation from each zone plate in a master array or master holographic element.
Figure 1B:
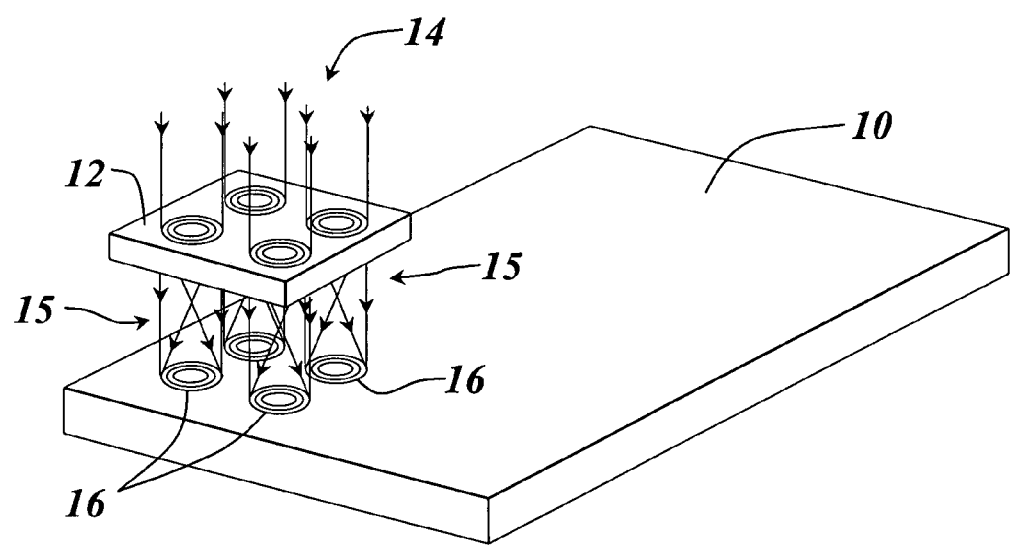
Figure 1C:
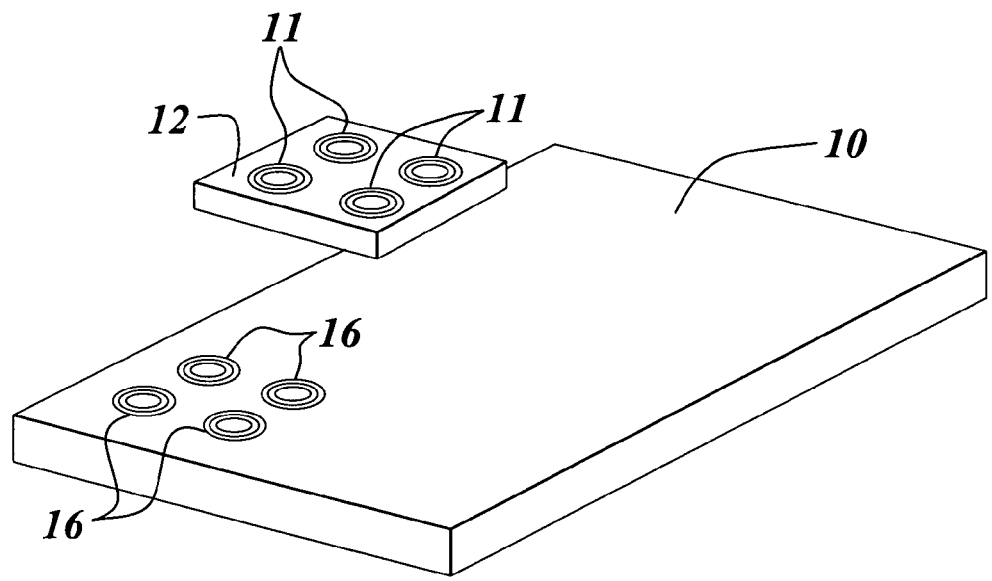
Figure 1D:
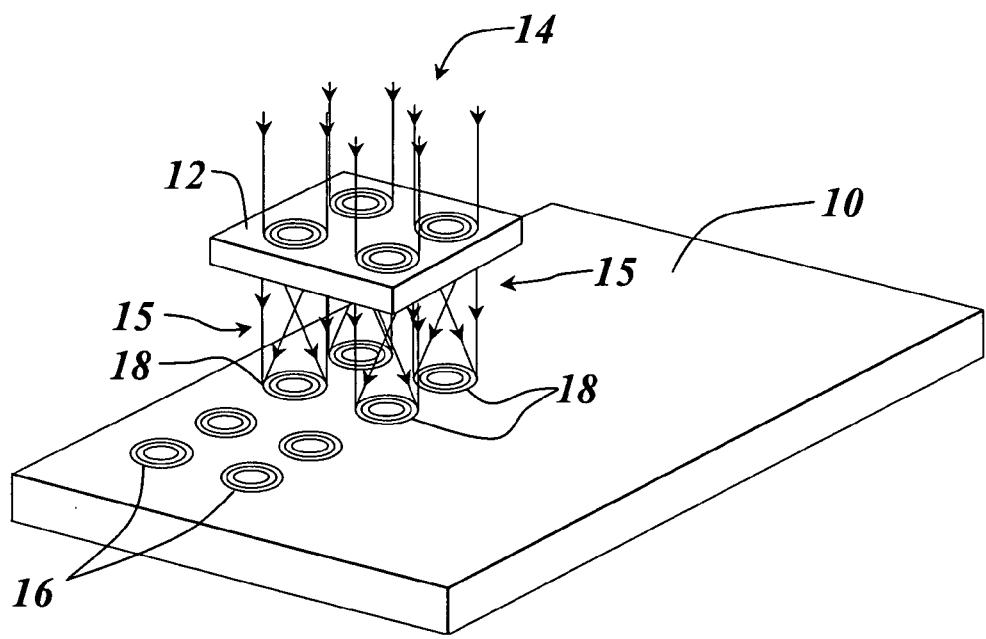

As shown in FIG. 1A, the MHE 12 is placed at the desired location relative to the target surface 10. The MHE 12 is then illuminated by an appropriate reference beam 14. The photosensitive target surface 10 is then exposed to a beam 15 that is diffracted by the MHE 12 at locations 16 as shown in FIG. 1B. The target surface 10 is then displaced relative to the MHE 12 as shown in FIG. 1C and re-exposed at adjacent locations 18 to create another array of patterns 18 on the target surface 10 as shown in FIG. 1D. Although the embodiments shown in the FIGS. 1A–1D show the use of arrays of four Fresnel zone plates 111 as the MHE 12, the MHE may include any number of one or more diffractive elements, which may be any of a wide variety of diffractive elements as discussed below.

The above embodiment uses the interference of the first and third orders of the same parent zone plate to create fringes that may be recorded as a daughter zone plate with smaller features. In this case, plane waves that are incident on the zone plate (phase or amplitude), will, after diffracting produce several orders, of which the first and the third are the strongest. The duty cycle of the zones in the parent zone plate maybe modified to achieve the desired efficiencies in certain orders as well. The recording medium is placed at a position between the zone plate and its first-order focal plane, resulting in a daughter zone plate with higher spatial frequencies. This may be preformed with not only a zone plate, but any element (diffractive or refractive, phase or amplitude), that may produce two spherical waves or any two different wavefronts that could be interfered to produce a desired fringe pattern and recorded.

Figure 2:
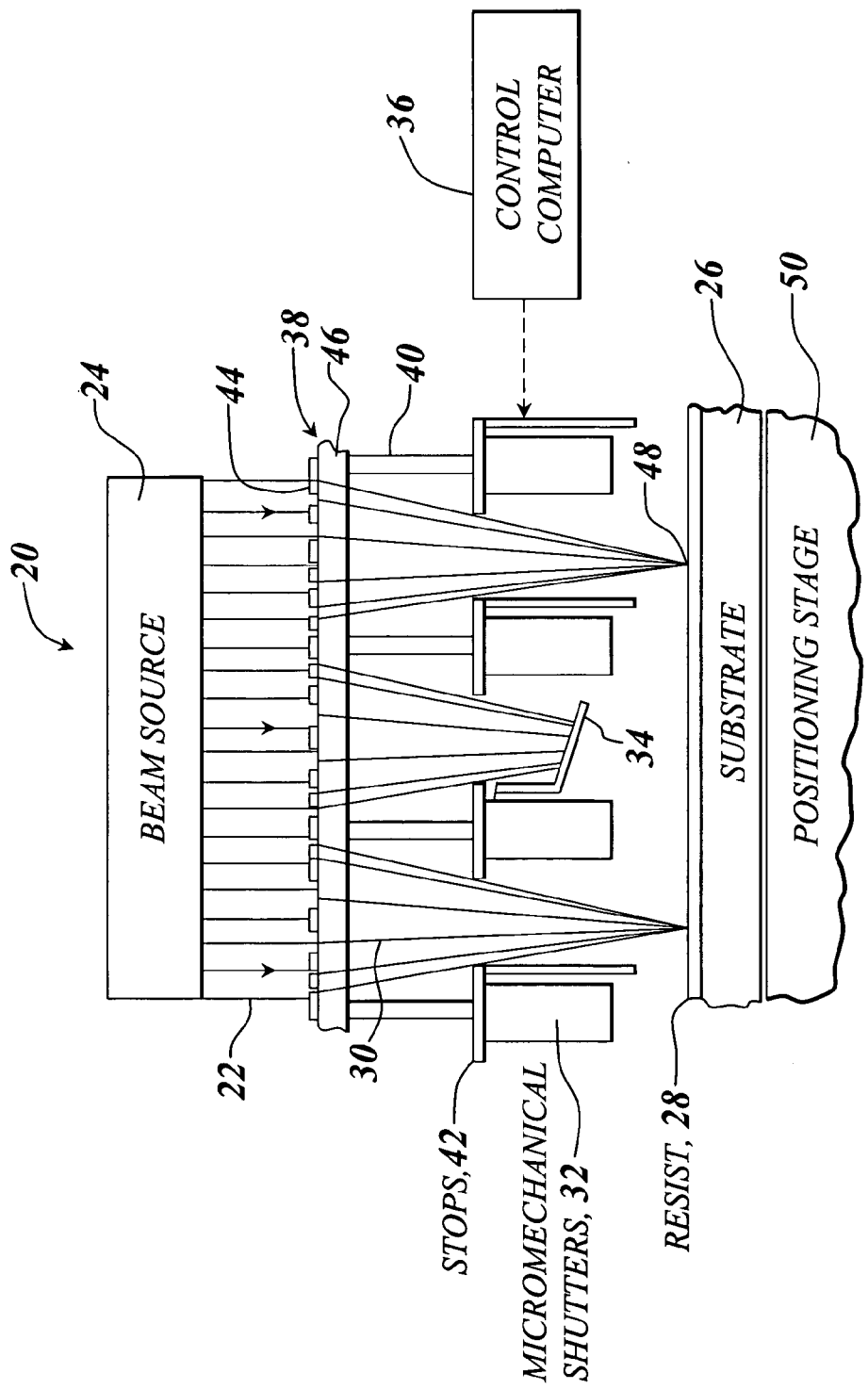
FIG. 2 shows an illustrative diagrammatic schematic view of an embodiment of a maskless lithography system including diffractive elements made in accordance with an embodiment of the invention.

The arrays of zone plates that may be formed in accordance with various embodiments of the invention may further be used, for example, in other lithography systems such as those disclosed in U.S. Pat. No. 5,900,637, the disclosure of which is hereby incorporated by reference. For example, the array of patterns may be used to provide an array of focusing elements in a lithography system as shown in FIG. 2 that includes a maskless lithography arrangement 20 in accordance with the invention illustrating the focusing of incident beam 22 from a beam source 24 onto a substrate 26 coated with a resist 28 as focused beamlets 30. The arrangement includes micro-mechanical shutter devices 32 with actuated shutters 34 that turn the focused beams on and off in response to commands from a control computer 36. The shutter devices 32 maybe interposed between the zone-plate array 38, joists 40, stops 42, and the substrate 26. The second beam from the left is indicated as being in the off state.

As shown, each of the zone plates 44 on the membrane 46 of the array 38 is able to focus a collimated beam 22 to a fine focal spot 48 on the resist-coated substrate 26, which is supported on a positioning stage 50. To write a pattern, the substrate is scanned under the array, while the individual beamlets 30 are turned on and off as needed by means of the micromechanical shutters 32, one associated with each zone plate. These shutters may be located either between the zone plate array and the substrate, i.e., down-stream, as illustrated in FIG. 2, or between the zone plate array and the source of radiation, i.e., up-stream, as shown in FIG. 3.

Figure 3:
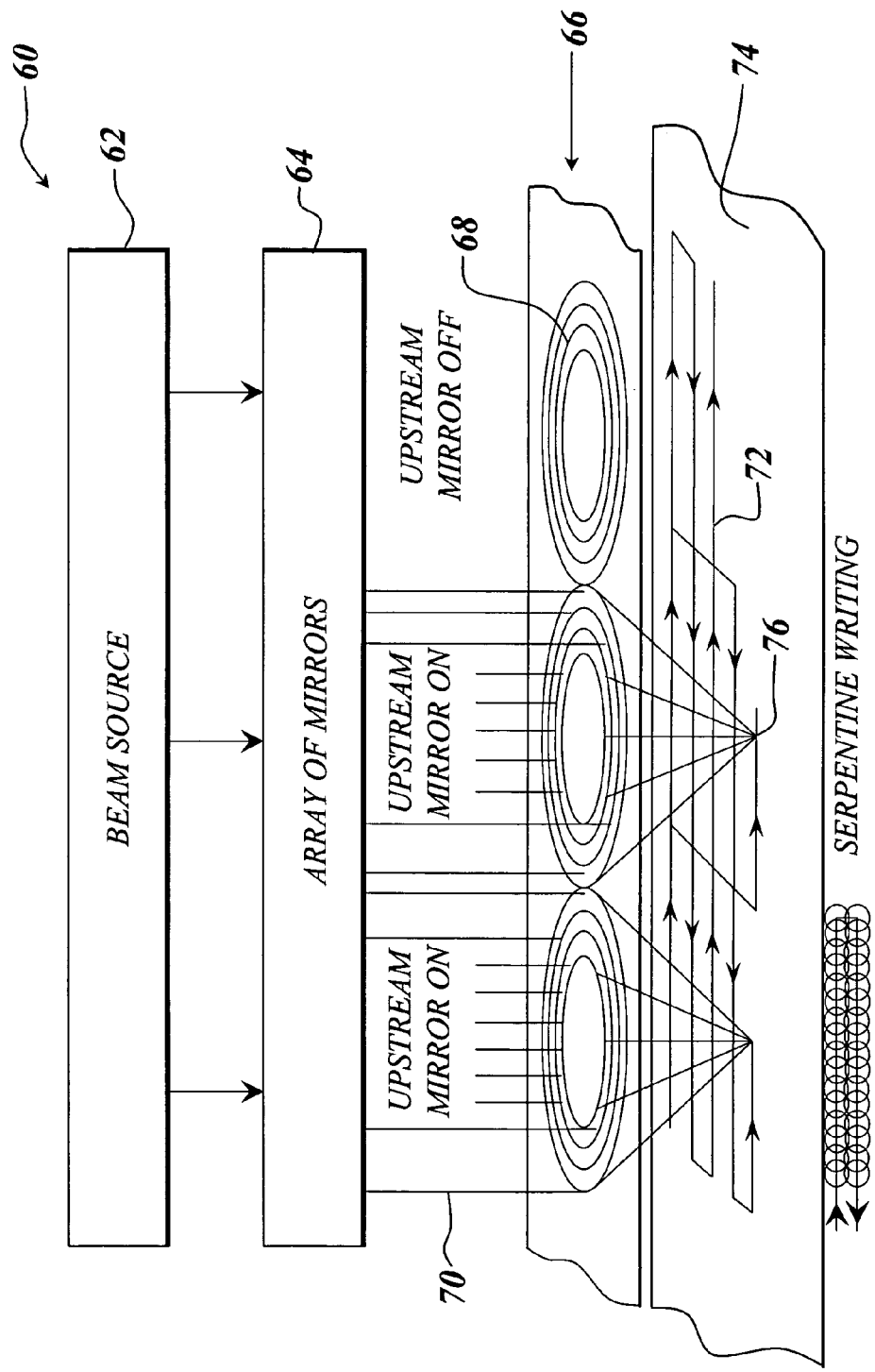
FIG. 3 shows an illustrative diagrammatic schematic view of another embodiment of a maskless lithography system including diffractive elements made in accordance with an embodiment of the invention.

FIG. 3 shows an illustration of a possible writing scheme used in connection with an embodiment of a maskless lithography system 60. The arrangement includes a radiation source 62 and an array of upstream mirrors 64 that are positioned between an array 66 of diffractive elements 68. A serpentine writing scheme is depicted, with the substrate scanned in X and Y by a fast piezoelectric system (not shown), thereby filling in the full pattern. Radiation is readily reflected at glancing angles from a polished surface. Accordingly, an array of micromechanical, deflectable glancing-angle mirrors 64, located upstream, may be used to turn individual focused beams 70 on and off. Texas Instruments, Inc. of Dallas, Tex. has developed a visible-light projection display system that employs an array of deflectable micromechanical mirrors. The technology for fabricating and deflecting such micromechanical mirrors, therefore, is known in the art.

There are various strategies through which the scanning and writing may be achieved. One is to employ a square array of zone plates, with each zone plate writing only within its unit cell as discussed above. The scanning in this case would be serpentine, as depicted at 72 in FIG. 3, with the positioning stage and hence the substrate 74 moving only a distance equal to the unit cell edge dimension in X and Y until all pixels within the unit cell are addressed, and either written (i.e., shutter open) at a focal spot 76 or not (i.e., shutter closed). An alternative to this step-and-scan strategy, is a linear-scan strategy similar to that described by M. Feldman, OSA Proceedings on Soft-X-ray Projection Lithography, Eds. A. M. Hawryluk and R. H. Stulen (Opt. Soc. Amer., Washington, D.C.) 18, 207 (1993), incorporated herein by reference. In Feldman's scheme, a close-packed array of zone plates would be azimuthally rotated relative to the scanning direction in such a way that all pixels can be addressed when the substrate is scanned along one direction only.

The focusing elements may be any of a variety of diffractive and/or refractive elements including those disclosed in U.S. patent application Ser. No. 10/624,316 filed Jul. 22, 2003, (the disclosure of which is hereby incorporated by reference), which claims priority to U.S. Provisional Applications Ser. Nos. 60/397,705 and 60/404,514, including, for example, amplitude and/or phase Fresnel zone plates, bessel zone plates, photon sieves (e.g., amplitude photon sieves, phase photon sieves, or alternating phase photon sieves), and the diffractive focusing elements may be apodized. These may be microfabricated in large arrays as well, and may be designed to compensate for wavefront characteristics in the radiation output from the source array to achieve, for example, the smallest possible focal spot.

An array of individually selectable switches may be employed to control the illumination from a single source or an array of individually selectable sources may be used, such as for example, semiconductor lasers, diode lasers, light emitting diodes, vertical cavity surface emitting lasers etc. as disclosed in U.S. patent application Ser. No. 10/628,809 filed Jul. 28, 2003 (the disclosure of which is hereby incorporated by reference), which claims priority to U.S. Patent Application Ser. No. 60/400,812.

Figure 4:
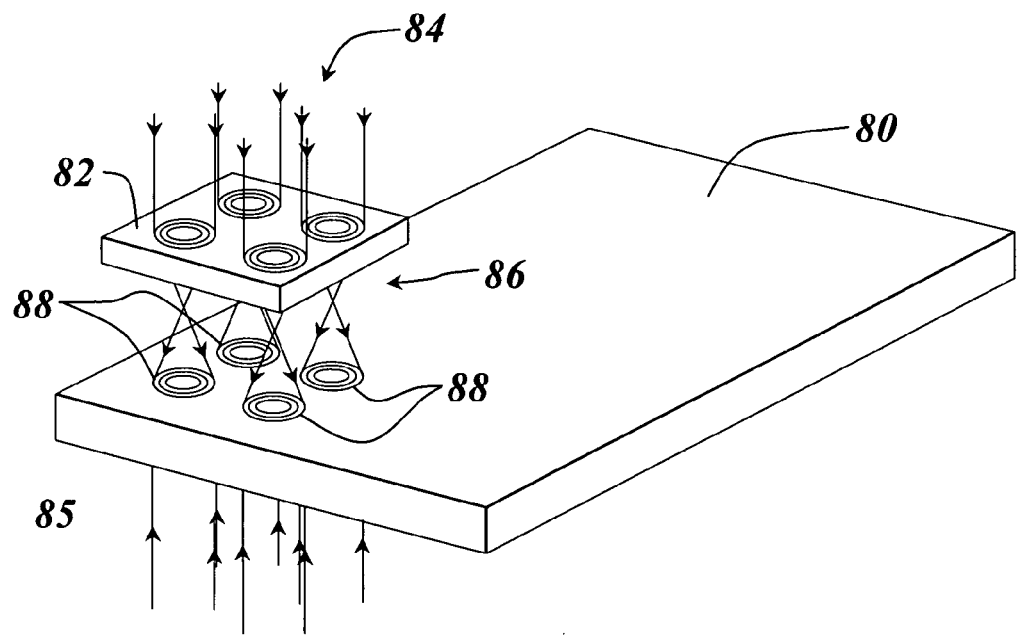
FIG. 4 shows an illustrative diagrammatic isometric view of a system in accordance with another embodiment of the invention in which an array of zone plates is replicated by the interference of the $1^{st}$ order radiation from each zone plate in a master array and a back-illuminated reference plane wave.

As shown in FIG. 4, in an alternative embodiment the target surface 80 may instead be exposed to the interference of the beams 84 that are diffracted by the MHE 82 and one or more additional beams 85 that are mutually coherent with each other and the beams 86 that are diffracted by the MHE 82, to create a pattern 88 on the target surface 80. For example, a spherical wave may be interfered with a plane wave to create a zone plate pattern as shown, for example, in *Holography Made Zone Plates for X-Ray Telescopes*, D. Rudolph and G. Schmahl, International Astronomical Union Symposium on New Techniques in Space Astronomy, pp. 205–206 (1971).

In the embodiment shown in FIG. 4, the uniform plane wave 84 incident on the zone plate 82 (phase or amplitude) or a lens is focused to a first order spot and diverges off (86) as a spherical wave beyond the focal plane of the zone plate 82. This diverging spherical wave interferes with the plane wave 85 traveling in the opposite direction, resulting in a Fresnel zone plate pattern 88 that is recorded in the photo-sensitive target surface 80. By exploiting the nonlinearity in the target surface response, a binary zone plate may be created. The geometry of this zone plate depends on the distance at which the fringes are recorded. If this distance is twice the focal length of the original zone plate, then the daughter zone plate is a clone of the original one. The reference plane waves may be incident from the backside of a glass substrate and the fringes may be recorded in photo-resist on the front surface. The fringes may also be recorded at a different wavelength than the one at which the element is used.

Figure 5:
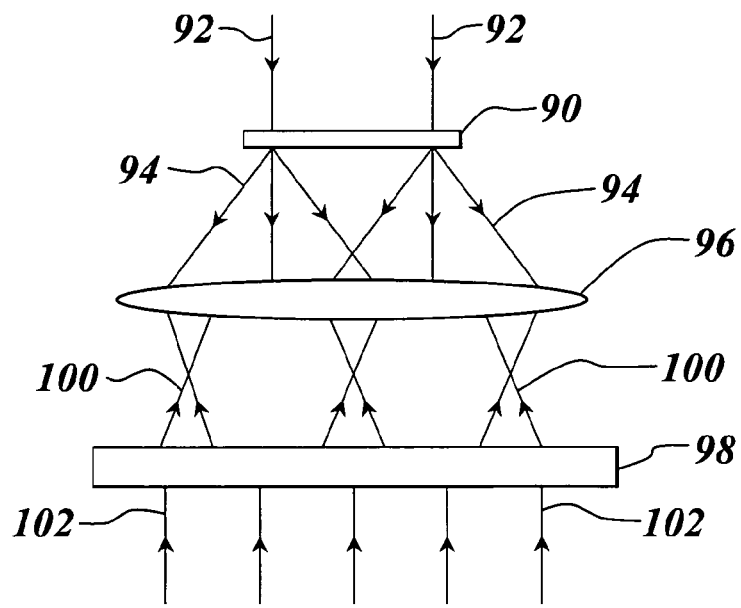
FIG. 5 shows an illustrative diagrammatic side view of a system in accordance with a further embodiment of the invention in which a daughter array of zone plates is fabricated by the interference of an array of spherical beams (created by a Dammann grating) and a back-illuminated reference plane wave.

In accordance with a further embodiment of the invention, the MHE is replicated optically by means of an array illuminator, for example a Dammann grating, resulting in the one-shot creation of the desired array of patterns onto the target surface as shown in FIG. 5. In particular, a grating 90 such as a Dammann grating (or other faceted aperture multiplexing grating), may be illuminated with an incident plane wave 92. The resulting illumination 94 from the grating 90 is focused by a lens 96 onto a substrate 98. The illumination 100 that is focused from the lens 96 onto the substrate 98 is interfered with a reference plane wave 102 that approaches the substrate 98 from the opposite direction as shown in FIG. 5.

The arrangement for the recording of the interference pattern may be any of the standard holographic recording geometries including on-axis, off-axis, transmission and reflection. As discussed above, possible embodiments for the elements of the array include phase or amplitude zone plates refractive microlenses, spatial light modulator pixels (electro-optic, micro-electro-mechanical, acousto-optic etc.) or other phase or amplitude modulating elements, which create the desired modulation of the incident wavefront.

Those skilled in the art will appreciate that numerous modifications and variations may be made to the above disclosed embodiments without departing from the spirit and scope of the invention.

What is claimed is:

1. A method of forming an array of focusing elements for use in a lithography system, said method comprising the steps of:

providing a master element that includes at least one diffractive pattern at a first location with respect to a target surface;

illuminating said master element to produce a first diffractive pattern on the target surface at said first location by interfering first and third order diffracted beams from said master element;

moving said master element with respect to said target surface to a second location with respect to the target surface; and illuminating said master element to produce a second diffractive pattern on the target surface at said second location.

2. The method as claimed in claim 1, wherein step of illumination said master element to produce the first diffractive pattern on the target surface at said first location involves the use of a Dammann grating.

3. The method as claimed in claim 1, wherein said first diffractive pattern includes a Fresnel zone plate.

4. The method as claimed in claim 1, wherein said first diffractive pattern is an amplitude Fresnel zone plate.

5. The method as claimed in claim 1, wherein said first diffractive pattern is a phase Fresnel zone plate.

6. The method as claimed in claim 1, wherein said diffractive pattern is apodized.

7. The method as claimed in claim 1, wherein said master element includes at least four diffractive patterns.

8. The method as claimed in claim 1, wherein said step of illuminating said master element to produce a first diffractive pattern on the target surface includes the use of a faceting aperture multiplexing grating.

9. The method as claimed in claim 1, wherein said step of illuminating said master element to produce a first diffractive pattern on said target involves mutliplexing a pattern on said master element to at least two patterns on said target surface.

10. A method of forming an array of focusing elements for use in a lithography system, said method comprising the steps of:

providing a master element that includes at least one diffractive pattern at a first location with respect to a target surface;

illuminating said master element to produce a first diffractive pattern on the target surface at said first location by interfering first and third order diffracted beams from said master element, said first diffractive pattern providing a first set of at least one focusing element for the lithography system;

moving said master element with respect to said target surface to a second location with respect to the target surface; and illuminating said master element to produce a second diffractive pattern on the target surface at said second location, said second diffractive pattern providing a second set of at least one focusing element for the lithography system.

11. A method of forming an array of focusing elements for use in a lithography system, said method comprising the steps of:

providing a master element that includes at least one diffractive pattern at a first location with respect to a target surface;

illuminating said master element to produce a first diffractive pattern on the target surface at said first location by interfering an incident plane wave on said master element with a reference plane wave that is directed in a direction that is generally opposite that of said incident plane wave;

moving said master element with respect to said target surface to a second location with respect to the target surface; and illuminating said master element to produce a second diffractive pattern on the target surface at said second location.

12. The method as claimed in claim 11, wherein step of illumination said master element to produce the first diffractive pattern on the target surface at said first location involves the use of a Dammann grating.

13. The method as claimed in claim 11, wherein said first diffractive pattern includes a Fresnel zone plate.

14. The method as claimed in claim 11, wherein said first diffractive pattern is an amplitude Fresnel zone plate.

15. The method as claimed in claim 11, wherein said first diffractive pattern is a phase Fresnel zone plate.

16. The method as claimed in claim 11, wherein said diffractive pattern is apodized.

17. The method as claimed in claim 11, wherein said master element includes at least four diffractive patterns.

18. The method as claimed in claim 11, wherein said step of illuminating said master element to produce a first diffractive pattern on the target surface includes the use of a faceting aperture multiplexing grating.

19. The method as claimed in claim 11, wherein said step of illuminating said master element to produce a first diffractive pattern on said target involves mutliplexing a pattern on said master element to at least two patterns on said target surface.

* * * * *